(12) United States Patent
Huang et al.

(10) Patent No.: US 9,485,854 B2
(45) Date of Patent: Nov. 1, 2016

(54) ABSORBING TERMINATION IN AN INTERCONNECT

(71) Applicant: Intel Corporation, Santa Clara, CA (US)

(72) Inventors: Shaowu Huang, Steilacoom, WA (US); Kai Xiao, University Place, WA (US); Beom-Taek Lee, Mountain View, CA (US); Boping Wu, King of Prussia, PA (US); Xiaoning Ye, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 85 days.

(21) Appl. No.: 14/464,279

(22) Filed: Aug. 20, 2014

(65) Prior Publication Data

US 2016/0057851 A1    Feb. 25, 2016

(51) Int. Cl.
| | |
|---|---|
| H05K 1/02 | (2006.01) |
| H01P 3/08 | (2006.01) |
| H01P 11/00 | (2006.01) |
| H05K 1/09 | (2006.01) |
| H05K 3/30 | (2006.01) |
| H05K 1/18 | (2006.01) |
| G06F 1/16 | (2006.01) |
| H01P 1/26 | (2006.01) |
| H01P 5/16 | (2006.01) |
| H04L 25/03 | (2006.01) |

(52) U.S. Cl.
CPC .............. *H05K 1/0216* (2013.01); *G06F 1/16* (2013.01); *H01P 1/268* (2013.01); *H01P 3/08* (2013.01); *H01P 5/16* (2013.01); *H01P 11/003* (2013.01); *H04L 25/03006* (2013.01); *H05K 1/0231* (2013.01); *H05K 1/0246* (2013.01); *H05K 1/0268* (2013.01); *H05K 1/09* (2013.01); *H05K 1/181* (2013.01); *H05K 1/0243* (2013.01); *H05K 3/303* (2013.01); *H05K 2201/10159* (2013.01); *H05K 2201/10204* (2013.01)

(58) Field of Classification Search
CPC ........ H05K 1/0216; G06F 1/16; H01P 1/268
USPC ................................. 333/109, 22 R
See application file for complete search history.

(56) References Cited

U.S. PATENT DOCUMENTS

| | | | |
|---|---|---|---|
| 6,680,623 B2* | 1/2004 | Hirai | H05K 1/0233 326/26 |
| 2006/0237223 A1* | 10/2006 | Chen | H05K 1/0218 174/255 |
| 2013/0252445 A1* | 9/2013 | Barr | H01R 13/6585 439/90 |
| 2015/0004849 A1 | 1/2015 | Caveney et al. | |

FOREIGN PATENT DOCUMENTS

DE          60312048 T2    2/2008

* cited by examiner

*Primary Examiner* — Stephen E Jones
*Assistant Examiner* — Scott S Outten
(74) *Attorney, Agent, or Firm* — Schwabe, Williamson & Wyatt, P.C.

(57) ABSTRACT

Embodiments of the present disclosure are directed toward techniques and configurations for electrical signal absorption in an interconnect disposed in a printed circuit board (PCB) assembly. In one instance, a PCB assembly may comprise a substrate, and an interconnect formed in the substrate to route an electrical signal within the PCB. The interconnect may be coupled with a connecting component that is disposed on a surface of the PCB. An absorbing material may be disposed on the PCB to be in direct contact with at least a portion of the connecting component to at least partially absorb a portion of the electrical signal. Other embodiments may be described and/or claimed.

25 Claims, 9 Drawing Sheets

ABSORBING TERMINATION IN AN INTERCONNECT

FIELD

Embodiments of the present disclosure generally relate to the field of printed circuit board design, and more particularly, to techniques and configurations for reducing reflected noise signals in connectors used in the printed circuit boards and/or terminating signals in cross-talk measurements.

BACKGROUND

Electric signals within multilayered printed circuit boards (PCBs), silicon dies, or package substrates are routed through interconnects, such as vias, connectors, transmission lines, and the like. Some interconnects may have connecting components, such as routing vias, ports, or connectors such as slots used for memory modules or memory cards. In some instances, undesired effects related to reflection of electrical signals may occur in interconnects. For example, not all connectors (e.g., memory module slots) disposed on a PCB may be in use, and some connectors may remain empty. Accordingly, electrical signals routed to the connectors may create undesired reflected noise signals in the empty connectors, which may negatively affect signaling performance of the PCB. For example, the reflected noise signals occurring in the empty connectors may distort desired signals passing through the occupied connectors and decrease the usable bandwidth of the interconnect.

In some instances, transmission lines in the PCBs may be tested (e.g., measured) for undesired effects caused by reflected noise signals, such as the effect known as cross-talk. In conventional measurement techniques, termination of electric signals used for measurements may be provided by using resistive termination. However, resistive termination may be difficult to implement. For example, connecting the resistors to precise positions on a transmission line disposed in a PCB may be time-consuming, costly, and often ineffective.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for electrical signal reflection and/or absorption for interconnects formed in a substrate of a printed circuit board (PCB) to route an electrical signal within the PCB. The interconnect may include a connecting component that may be at least partially disposed on a surface of the PCB, and an absorbing material that may be disposed to be in direct contact with at least a portion of the connecting component to at least partially absorb a portion of the electrical signal.

To provide the desired absorption level, the absorbing material may be selected to satisfy certain conditions. For example, a desired absorption may be achieved when the absorbing material has a dielectric loss tangent that is greater than one for a frequency range of the resonant frequency of the reflected signal and a dielectric constant that is inversely proportional to the frequency of the reflected signal.

The described techniques invention provide several advantages over resistive terminations. For example, the described embodiments allows the termination to be operated without permanently adding components, and for more robust de-embedding or calibration to be designed. The termination created with absorbing material may be more flexible and robust than resistive termination. The absorbing material may be commercially available in different states: foam, plastic, ad hesive/glue, type, film, etc.

The described embodiments may provide desirable wideband termination, which is the key for high speed measurement. The termination created by absorbing material may perform better than that by resistive termination in high frequency and high speed region. Broadband absorbing materials, which have excellent absorption over broadband microwave and millimeter frequencies, have been commercially available.

The described embodiments may also provide narrowband or half-band termination, which are desirable for some special characterization measurements. Narrowband absorbers have also been commercially available and provide decent narrowband or half-band termination.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first layer formed, deposited, or otherwise disposed on a second layer" may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

The embodiments of the present disclosure will be described in reference to FIGS. 1-3. The embodiments may include an apparatus comprising a dielectric layer and an interconnect (e.g., formed in the dielectric layer) to route an electrical signal through the dielectric layer, where the interconnect includes a connecting component on the interconnect, and at least a portion of the connecting component may be covered with an absorbing material to at least partially absorb a portion of the electric signal (e.g., reflected noise signal). In some embodiments, the apparatus may comprise a PCB assembly, a die, a package substrate, or a printed circuit board.

Figure 1:
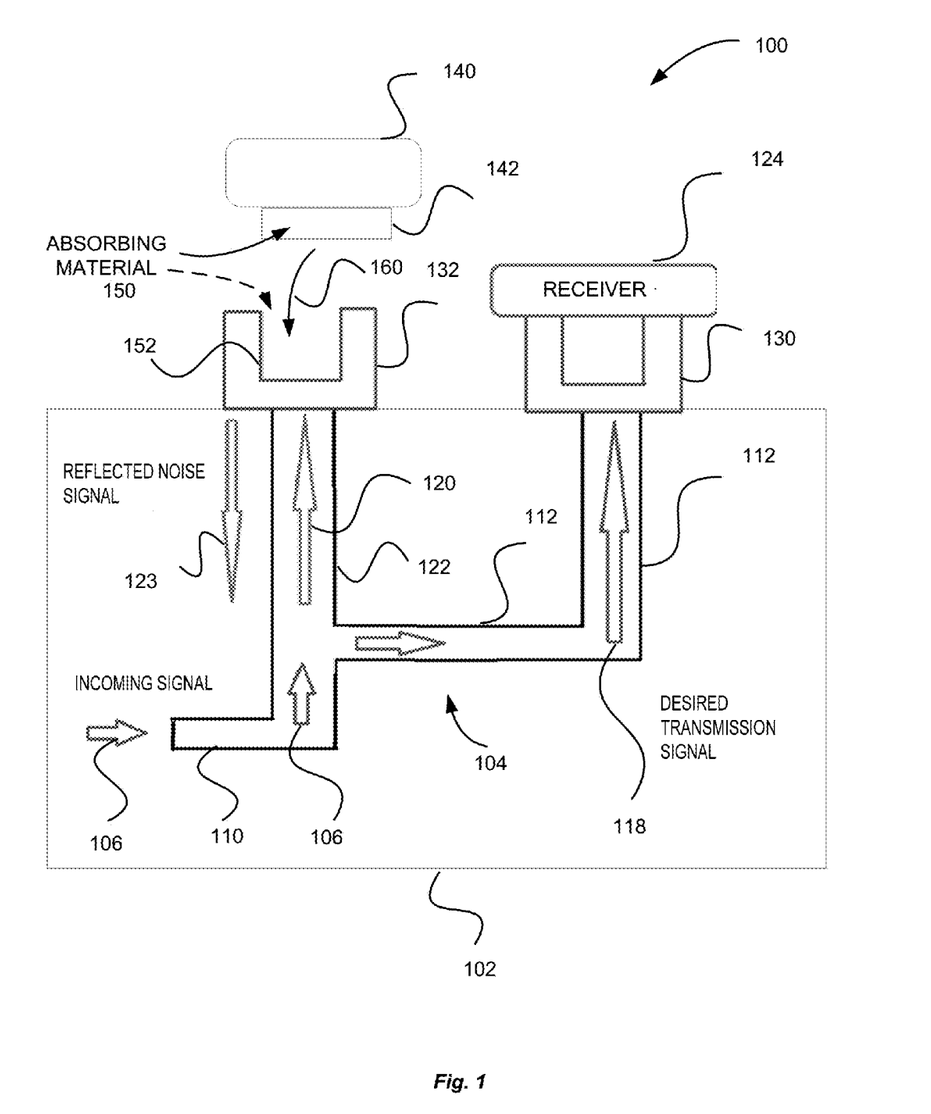
FIG. 1 illustrates a schematic diagram of an example printed circuit board (PCB) assembly, in accordance with some embodiments.

FIG. 1 illustrates a schematic diagram of an example printed circuit board (PCB) assembly 100, in accordance with some embodiments. The PCB assembly 100 may comprise a substrate 102. The substrate 102 may be a substrate made of dielectric material including, for example, build-up layers (not shown) configured to route electrical signals through the PCB assembly 100. The PCB assembly 100 may include one or more interconnects (such as interconnect 104) configured to route electrical signals 106 such as, for example, input/output (I/O) signals and/or power or ground signals associated with the operation of the PCB assembly 100. In some embodiments, the interconnect 104 may comprise a via filled with a conductive material, such as copper, to provide for electrical conductivity for the incoming signal 106.

The interconnect 104 may further comprise one or more connecting components 130, 132 that may be disposed on a surface of the PCB assembly 100, e.g., on a surface of the substrate 102. In some embodiments, an absorbing material may be disposed to be in direct contact with at least a portion of the connecting component 130 or 132 to at least partially absorb a portion of the electrical signal traveling through the interconnect 104, as will be described below in greater detail.

In some embodiments, the interconnect 104 may comprise one or more transmission lines coupled with connecting components 130, 132 (e.g., ports) that may be at least partially disposed on the surface of the substrate 102, as will be discussed in greater detail in reference to FIGS. 4-10.

In some embodiments, the connecting components 130, 132 may comprise connector slots configured to receive corresponding connecting elements of respective computing components (e.g., receiver 124) to be coupled with the PCB assembly 100. The computing components may comprise various types of components of a computing device or system that may be coupled to the PCB assembly 100, via the connecting components 130, 132. For example, the computing component (e.g., receiver) 124 may comprise a memory module, such as a dual in-line memory module (DIMM), to receive and store data comprising the electrical signal 106 routed within the PCB assembly 100. As known, the computing component 124, such as a DIMM, may have a connecting element (not shown) configured to be insertable in the connecting component (slot) 130, to couple the computing component 124 with the PCB assembly 100.

In some embodiments, the incoming signal 106 may be routed via an electrically conductive trace (e.g., transmission line 110) into the interconnect 104, to the receiver 124 (e.g., memory module or other computing component) via another electrically conductive line 112, as shown. Accordingly, the incoming signal 106 may be split into two portions. One portion, a desired transmission signal 118, may travel to a receiving point via the conductive line 112, while another portion 120 may continue traveling through a conductive line 122 of the interconnect 104, forming a reflected noise signal 123, reflected off the empty connecting component (slot) 132. The reflected noise signal 123 may comprise surface waves and/or evanescent waves, and may include some propagating waves. The reflected noise signal 123 may cause undesirable effects for the interconnect 104, for example, distort desired signal 118 passing through the line 112 to the receiver 124 and decrease the usable bandwidth of the interconnect 104.

To mitigate undesirable effects related to the reflected noise signal 123, in some embodiments, a component 140 may be coupled with the PCB assembly 100 via the connecting component 132. In some embodiments, the component 140 may comprise an insertable component, e.g., a computing component. In some embodiments, the component 140 may comprise an insertable component, such as, for example, a dummy module. The component 140 may have a connecting element 142 for insertion into the connecting component (slot) 132, as indicated by arrow 160. The connecting element 142 of the insertable component 140 (e.g., dummy module) may include absorbing material 150. For example, a layer of absorbing material 150 may be applied to the connecting element 142 to at least partially cover the contacts of the connecting element insertable into the connecting component (slot) 132. Accordingly, the connecting component 132 may be covered with the absorbing material 150 when the connecting element 142 of the component 140 (e.g., dummy module) is inserted into the connecting component (slot) 132, such that the absorbing material 150 may be in direct contact with an inside portion 152 of the connecting component (slot) 132.

The absorbing material 150 covering at least a portion of the connecting component 132 may at least partially absorb the reflected noise signal 123 formed by the inbound signal 120 when reflected off the connecting component 132, thus reducing inter-symbol interference (ISI) and harmful coupling, and correcting timing jitter that may be induced by the reflected noise signal 123. The reduction of the reflected noise signal 123 using the absorbing material 150 may be particularly effective in high-speed signaling, e.g., at frequencies ranging from about 5 to 7 GHz, such as for connecting component (slot) 132 being a DIMM connector. FIG. 2 schematically illustrates a signaling diagram 200 of a PCB assembly 100 having an interconnect 104, in accordance with some embodiments. The diagram 200 illustrates the elements of the interconnect 104 in greater detail. It is assumed that the signal 106 may be generated by a central processing unit 204, which for purposes of simplicity may considered as a transmitter of the signal 106 via the interconnect 104, to be received by a computing component 224 (e.g., receiver 124 such as a memory module). (Conversely, the central processing unit 204 may be a receiver of a signal transmitted by the computing component 224 via the interconnect 104. However, the principle of the described embodiments remains the same.) In some embodiments, the PCB assembly 100 may comprise a motherboard of a computing system.

As shown, the signal 106 may travel through various components of the interconnect 104, including socket 206, one or more vias 208, breakout 210 (e.g., channel transmission or receiver signal routing components), open route 212 (e.g., regular PCB routing outside of the special routing areas such as breakout, pinfield, etc.), pinfield 214 (e.g., a PCB area where multiple dense pins may be disposed, such as, for example, the PCB area underneath the connector), and interconnect elements 216 and 218 (e.g., DIMM-DIMM in case the computing component 224 insertable in connecting component 130 and corresponding computing component (e.g., 140) insertable in connecting component 132 may comprise DIMM).

As described in reference to FIG. 1, if connecting component 132 remains empty in the above configuration, a component 140 (e.g., dummy module) with connecting element 142 covered with absorbing material may be inserted 280 into the connecting component 132, in order to at least partially absorb a portion of the incoming signal 106 traveling toward 132, and substantially reduce the reflected noise signal.

Figure 3:
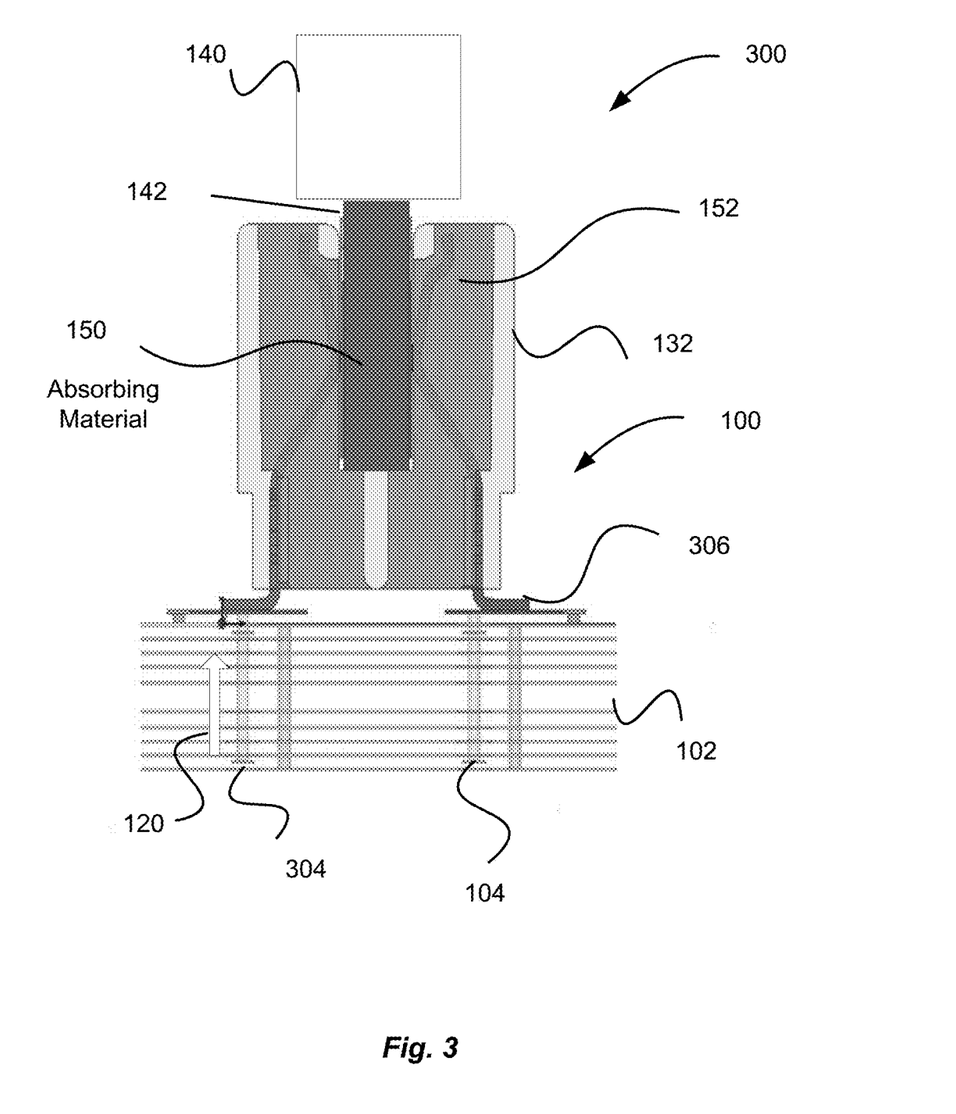
FIG. 3 illustrates a cross-section view of an example connecting component of an interconnect of FIGS. 1-2 coupled with a PCB assembly, in accordance with some embodiments.

FIG. 3 illustrates a cross-section view 300 of an example connecting component 132 coupled with a PCB such as PCB assembly 100, in accordance with some embodiments. As shown, the connecting component 132 may be coupled with (e.g., mounted on a surface of) the substrate 102 of the PCB assembly 100. Some of the components of the interconnect 104 (e.g., vias for providing electrical connection for an electrical signal traveling through the PCB assembly 100) are also shown and denoted by numeral 304. The connecting component 132 may include one or more connection elements 306, such as pins or gold finger contacts comprising the inside portion 152 of the connecting component 132.

As shown, a component 140, such as dummy module, may be inserted into the connecting component 132, to provide a direct contact for absorbing material 150 covering the connecting element 142 with the connection elements 306, to at least partially absorb the inbound signal 120 traveling through the interconnect 104 to the connecting component 132 to reduce or substantially eliminate reflected noise (e.g., signal 123 in FIG. 1.)

Besides the embodiments described in reference to FIG. 3, the absorbing material 150 may be used to mitigate the undesired effects for other types of embodiments that may be used in PCB signaling and measurements, such as high-speed (e.g., 1 or 1.5 gigabits per second (Gbps) and above, such as for the double data rate (DDR) memory interfaces), which are described in reference to FIGS. 4-10.

Figure 4:
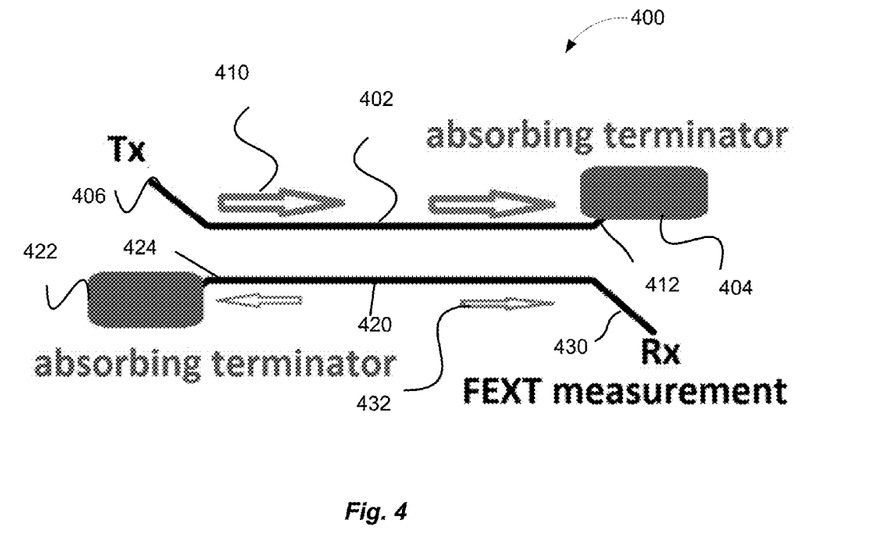
FIG. 4 is an example schematic diagram for signal measurements in a PCB assembly, in accordance with some embodiments.

FIG. 4 is an example schematic diagram for signal measurements in a PCB assembly, in accordance with some embodiments. More specifically, FIG. 4 illustrates an example schematic representation for far end cross-talk (FEXT) measurements in a PCB assembly. The schematic representation may include an interconnect 400 disposed on a PCB (not shown).

The interconnect 400 may comprise a first transmission line 402 that may include a connecting component 404. A first end 406 of the transmission line 402 may be connected to a transmitter Tx (not shown) to transmit an electrical signal 410 through the transmission line 402. In some embodiments, a second (far) end 412 of the transmission line 402 may be disposed on the surface of the PCB to form a port for the electrical signal 410 passing through the transmission line 402. Accordingly, the second (proximal) end 412 may comprise the connecting component 404 (port). In some embodiments, the connecting component 404 (e.g., port) may be at least partially covered with the absorbing material to form an absorbing terminator to provide substantial termination of the electrical signal 410.

The interconnect 400 may further comprise a second transmission line 420 disposed in proximity to the first transmission line 402. The second transmission line 420 may include a second absorbing terminator 422 comprising a first end 424 of the second transmission line 420. The absorbing terminator 422 may be covered with the absorbing material as will be described below in greater detail.

The first end 424 of the second transmission line 420 may be disposed in proximity to the first end 406 of the first transmission line 402. A second end 430 of the second transmission line 420 may be connected to a receiver Rx (not shown) of a signal 432 caused by magnetic interference from the electric signal 410 passing through the first transmission line 402. Accordingly, the schematic representation of interconnect 400 including the first and second transmission lines 402 and 420 configured as described above may enable FEXT measurements associated with the electrical signal 410.

Figure 5:
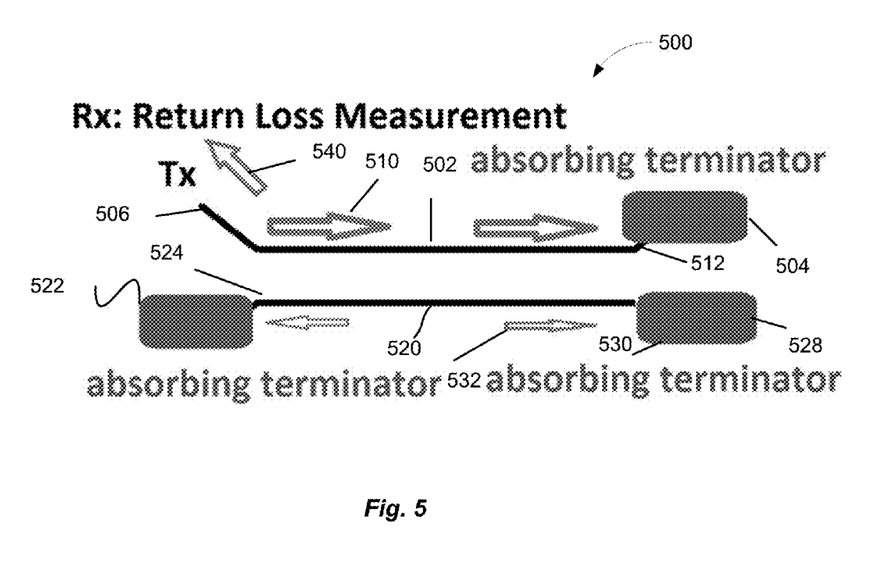
FIG. 5 is another example schematic diagram for signal measurements in a PCB assembly, in accordance with some embodiments.

FIG. 5 is another example schematic diagram for signal measurements in a PCB assembly, in accordance with some embodiments. More specifically, FIG. 5 illustrates an example schematic representation for FEXT return loss measurements in a PCB assembly. The schematic representation may include an interconnect 500 disposed in the PCB (not shown).

Similarly to the embodiment described in reference to FIG. 4, the interconnect 500 may comprise a first transmission line 502 that may include a connecting component 504. A first end 506 of the transmission line 502 may be connected to a transmitter Tx (not shown) to transmit an electrical signal 510 through the transmission line 502. In some embodiments, a second (proximal) end 512 of the transmission line 502 may be disposed on the surface of the PCB to form a port for the electrical signal 510 passing through the transmission line 502. Accordingly, the second (proximal) end 512 may comprise the connecting component 504 (port). In some embodiments, the connecting component 504 (e.g., port) may be at least partially covered with the absorbing material to form an absorbing terminator to provide substantial termination of the electrical signal 510. A return loss signal 540 resulting from discontinuity of the signal 510 may be received by a receiver Rx (not shown) connected to the first end 506 and measured accordingly.

The interconnect 500 may further comprise a second transmission line 520 disposed in proximity to the first transmission line 502. The second transmission line 520 may include a second absorbing terminator 522 comprising a first end 524 of the second transmission line 420. A third absorbing terminator 528 may be disposed at a second end 530 of the second transmission line 520, to substantially terminate a signal 532 caused by magnetic interference from the electric signal 510 passing through the first transmission line 502. The absorbing terminators 522 and 528 may be covered with the absorbing material as will be described below in greater detail. Accordingly, the schematic representation of interconnect 500 including the first and second transmission lines 502 and 520 as described above may enable measurements of FEXT return loss associated with the electrical signal 510.

Figure 6:
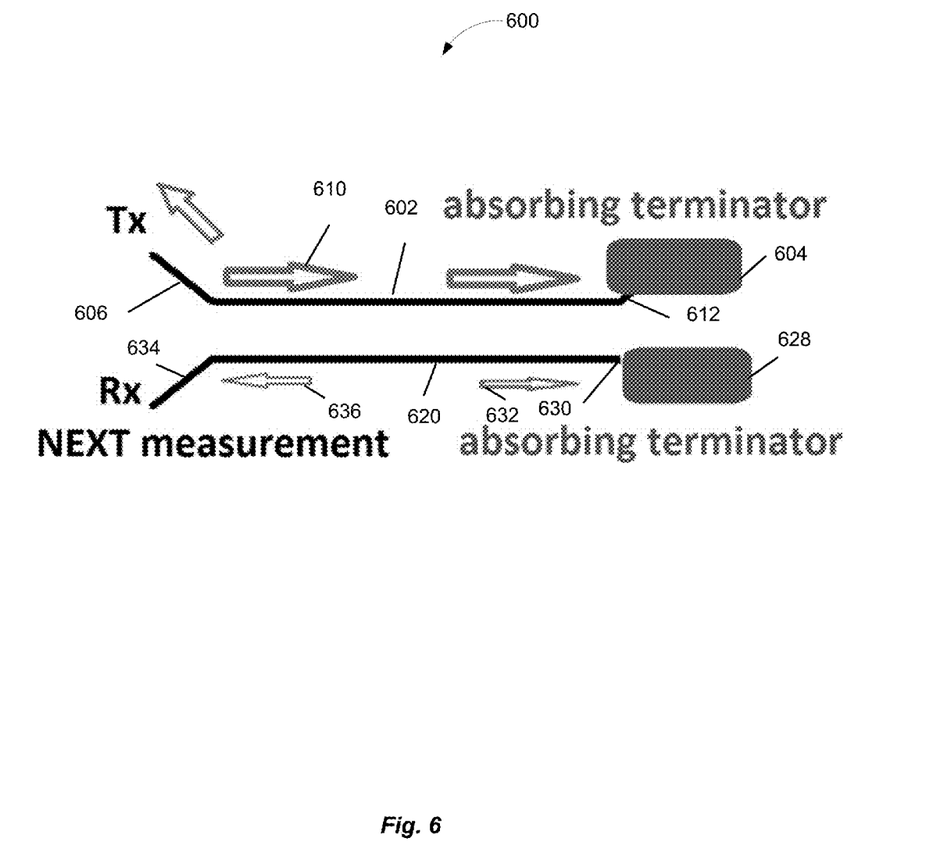
FIG. 6 is another example schematic diagram for signal measurements in a PCB assembly, in accordance with some embodiments.

FIG. 6 is another example schematic diagram for signal measurements in a PCB assembly, in accordance with some embodiments. More specifically, FIG. 6 illustrates an example schematic representation for near end cross-talk (NEXT) measurements in a PCB assembly. The schematic representation may include an interconnect 600 disposed in the PCB (not shown).

Similarly to the embodiment described in reference to FIGS. 4 and 5, the interconnect 600 may comprise a first transmission line 602 that may include a connecting component 604. A first end 606 of the transmission line 602 may be connected to a transmitter Tx (not shown) to transmit an electrical signal 610 through the transmission line 602. In some embodiments, a second (proximal) end 612 of the transmission line 602 may be disposed on the surface of the PCB to form a port for the electrical signal 610 passing through the transmission line 602. Accordingly, the second (proximal) end 612 may comprise the connecting component 604 (port). In some embodiments, the connecting component 604 (e.g., port) may be at least partially covered with the absorbing material to form an absorbing terminator to provide substantial termination of the electrical signal 610.

The interconnect 600 may further comprise a second transmission line 620 disposed in proximity to the first transmission line 602. The second transmission line 620 may include a second absorbing terminator 628 comprising a first end 630 of the second transmission line 620. The second absorbing terminator 628 may be covered with the absorbing material to form an absorbing terminator to provide substantial termination of the signal 632 caused by magnetic interference from the electric signal 610 passing through the first transmission line 602. A second end 634 of the second transmission line 620 may be disposed in proximity to the first end 606 of the first transmission line 602 and connected to a receiver Rx (not shown) of a signal 636 caused by magnetic interference from the electric signal 610 passing through the first transmission line 602. Accordingly, the schematic representation of interconnect 600 including the first and second transmission lines 602 and 620 configured as described above may enable measurements of near end cross-talk associated with the electrical signal 610.

Figure 7:
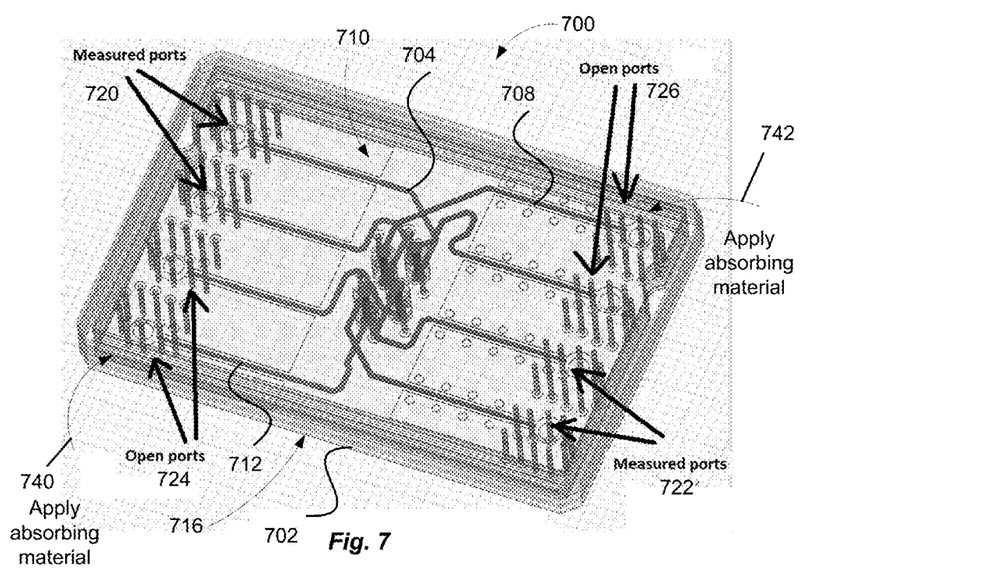
FIGS. 7-10 illustrate perspective views of example implementations of absorbing terminators formed from absorbing materials in a PCB assembly configured for signal measurements as described in reference to FIGS. 4 and 6, in accordance with some embodiments.
Figure 8:
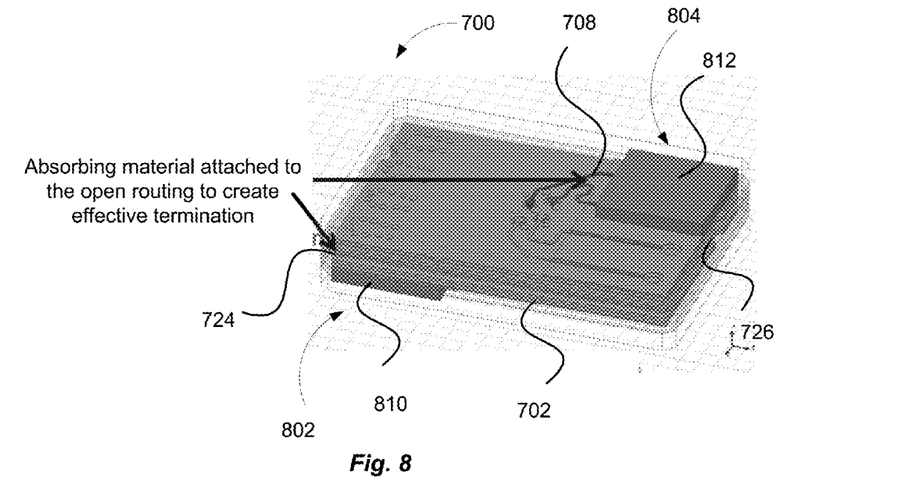
Figure 9:
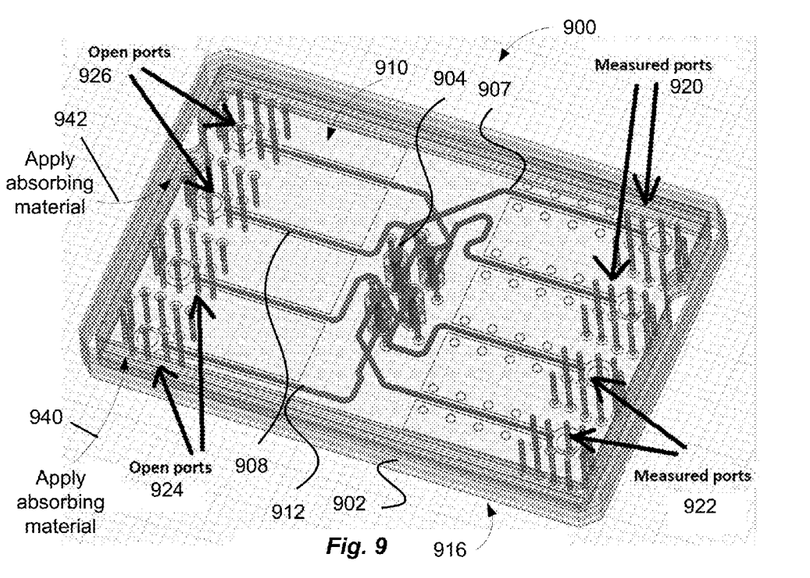
Figure 10:
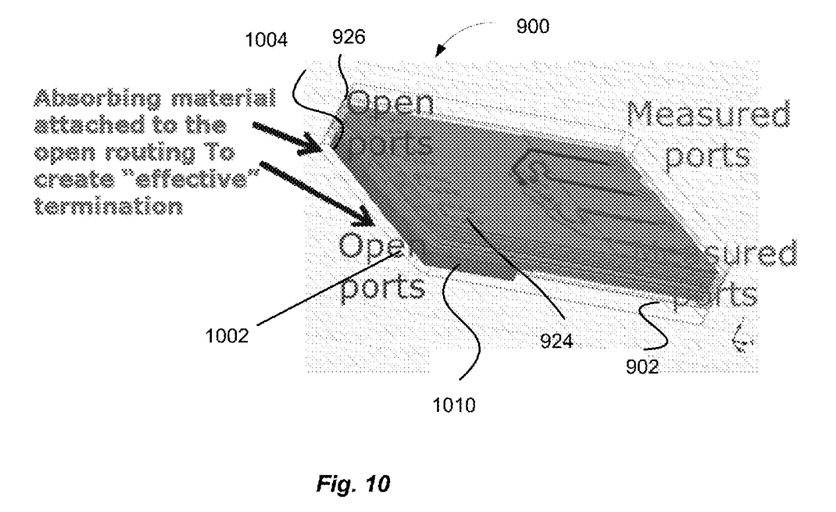

FIGS. 7-10 illustrate perspective views of example implementations of absorbing terminators formed from absorbing materials in a PCB assembly configured for signal measurements as described in reference to FIGS. 4 and 6, in accordance with some embodiments. More specifically, FIGS. 7-8 illustrate example implementations of absorbing terminators in a PCB assembly used for FEXT measurements, and FIGS. 9-10 illustrate example implementations of absorbing terminators in a PCB assembly used for NEXT measurements.

FIG. 7 illustrates a perspective view of an example implementation of the schematic representation of the PCB assembly with the interconnect 400 of FIG. 4, in accordance with some embodiments. The example implementation may include a PCB assembly 700 including a substrate 702, on which an interconnect 704 similar to 400 may be disposed. As shown, some transmission lines of the interconnect 400 corresponding to lines 402 and 420 (e.g., line 708) may be disposed on a first (e.g., top) surface 710 of the substrate 702, and others (e.g., 712) may be disposed on a second (e.g., bottom) surface 716 of the substrate 702. It will be appreciated that the above-described configuration of the interconnect 700 is provided for illustration purposes only; other configurations (e.g., having one or more or all transmission lines on one surface of the substrate 702) are possible.

The measured ports 720 and 722 in FIG. 7 correspond to respective ends 406 and 430 of the transmission lines 402 and 420 of FIG. 4, and the open ports 724 and 726 correspond to respective ends 412 and 424 of the transmission lines 402 and 420 of FIG. 4. In order to provide termination of signal traveling, e.g., in lines 712 and 708 to respective open ports 724 and 726, the absorbing terminators may be formed on the ports 724 and 726 as described in reference to FIG. 4. More specifically, absorbing material may be applied to the open ports 724 and 726, as indicated by arrows 740 and 742, in order to substantially terminate the signals traveling to these ports.

FIG. 8 illustrates another perspective view of an example implementation of the schematic representation of the PCB assembly with the interconnect 400 of FIG. 4, in accordance with some embodiments. More specifically, FIG. 8 illustrates an implementation of the schematic representation of interconnect 400 similar to that of FIG. 7 showing the PCB assembly 700 with absorbing terminators 802 and 804 formed on the ports 724 and 726 respectively. As shown, layers of absorbing material 810 and 812 may be applied (e.g., attached) to the open ports 724 and 726 on each side of the substrate 702, covering the ports to provide effective termination of signals traveling to these ports. As shown, the layers of absorbing material 810 and 812 may cover, at least partially, portions of transmission lines 708 and 712 (not visible in FIG. 8) around proximal ends of these lines that form the ports 724 and 726. The layers of absorbing material 810 and 812 may be applied to the substrate 702 and retained in place in a number of different ways, including, but not limited to, fastening, gluing, applying pressure, or other methods known in the art.

FIG. 9 illustrates a perspective view of an example implementation of the schematic representation of the PCB assembly with the interconnect 600, in accordance with some embodiments. The example implementation may include a PCB assembly 900 including a substrate 902, on which an interconnect 904 similar to 600 may be disposed. As shown, some transmission lines of the interconnect 900 corresponding to lines 402 and 420 (e.g., line 907) may be disposed on a first (e.g., top) surface 910 of the substrate 902, and others (e.g., 908, 912) may be disposed on a second (e.g., bottom) surface 916 of the substrate 902. It will be appreciated that the above-described configuration of the interconnect 900 is provided for illustration purposes only; other configurations (e.g., having one or more or all transmission lines on one surface of the substrate 902) are possible.

The measured ports 920 and 922 in FIG. 9 correspond to respective ends 606 and 634 of the transmission lines 602 and 620 of FIG. 6, and the open ports 924 and 926 correspond to respective ends 612 and 630 of the transmission lines 602 and 620 of FIG. 6. In order to provide termination of signal traveling, e.g., in lines 912 and 908 to respective open ports 924 and 926, the absorbing terminators may be formed on the ports 924 and 926 as described in reference to FIG. 6. More specifically, absorbing material may be applied to the open ports 924 and 926, as indicated by arrows 940 and 942, in order to substantially terminate the signals traveling to these ports.

FIG. 10 illustrates another perspective view of an example implementation of the schematic representation of the PCB assembly 900 with the interconnect 600 of FIG. 6, in accordance with some embodiments. More specifically, FIG. 10 illustrates an implementation of a schematic representation similar to that of FIG. 9 showing the PCB assembly 900 with absorbing terminators 1002 and 1004 formed on the ports 924 and 926 respectively. As shown, at least one layer of absorbing material 1010 may be applied (e.g., attached) to the open ports 924 and 926 on the surface 916 of the substrate 902, covering the ports 924 and 926 to provide effective termination of signals traveling to these ports. As shown, the layer of absorbing material 1010 may cover, at least partially, portions of transmission lines 908 and 912 (not visible in FIG. 10) around proximal ends of these lines that form the ports 924 and 926. The layer of absorbing material 1010 may be applied to the substrate 902 and retained in place in a number of different ways, including, but not limited to, fastening, gluing, applying pressure, or other methods known in the art.

In some embodiments, the absorbing material (e.g., 150, 810, 812, and/or 1010 referenced above) may be selected so as to cause the reflected noise signal (e.g., 123) comprising, e.g., electromagnetic waves entering the absorbing material to attenuate quickly and dissipate as heat, thus reducing or eliminating the reflected noise signal. The wave propagation factor for electromagnetic wave of the reflected noise signal may be derived as follows.

The electromagnetic wave number in vacuum (free space) may be defined as $$k_0 = \frac{2\pi}{\lambda_0}$$

where $k_0$ and $\lambda_0$ are the electromagnetic wave number and wavelength in vacuum.

The electromagnetic wave number in media k (e.g., absorbing material with relative permittivity $\tilde{\epsilon}_r$ and relative permeability $\tilde{\mu}_r$) may be written as $$k = k_0\sqrt{\tilde{\mu}_r\tilde{\epsilon}_r}$$

Since $\tilde{\epsilon}_r = \epsilon_r(1+j\tan\delta)$, where $\tan\delta$ is loss tangent of the absorbing material, $\delta$ is the angle of loss tangent, $\epsilon_r$ is the relative dielectric constant of the absorbing material, and non-magnetic material permeability $\tilde{\mu}_r=1$, the electromagnetic wave number k may be defined as $$k = k_0\sqrt{\epsilon_r(1+j\tan\delta)},$$

where j is the imaginary unit.

The wave propagation factor may be derived from a Maxwell equation following the following sequence of expressions:

$$\exp(jkd) = \exp\left(jdk_0\sqrt{\epsilon_r(1+j\tan\delta)}\right)$$

or $$\exp(jkd) = \exp\left(jd\frac{2\pi}{\lambda_0}\sqrt{\epsilon_r(1+j\tan\delta)}\right)$$

where d is the distance of wave propagation inside the absorbing material and $\lambda_0$ is wavelength of free space. The above expression may be written as follows:

$$\exp(jkd) = \exp\left(jd\frac{2\pi}{\lambda_0}\left[\text{real}\left(\sqrt{\epsilon_r(1+j\tan\delta)}\right) + j\cdot\text{imag}\left(\sqrt{\epsilon_r(1+j\tan\delta)}\right)\right]\right)$$

or $$\exp(jkd) = \exp\left(d\frac{2\pi}{\lambda_0}\left[j\text{real}\left(\sqrt{\epsilon_r(1+j\tan\delta)}\right) - \text{imag}\left(\sqrt{\epsilon_r(1+j\tan\delta)}\right)\right]\right)$$

The final expression may be written as follows:

$$\exp(jkd) = \exp\left(jd\frac{2\pi}{\lambda_0}\text{real}\left(\sqrt{\epsilon_r(1+j\tan\delta)}\right)\right)\exp\left(-d\frac{2\pi}{\lambda_0}\text{imag}\left(\sqrt{\epsilon_r(1+j\tan\delta)}\right)\right)$$

with loss factor being $$\exp\left(-d\frac{2\pi}{\lambda_0}\text{imag}\left(\sqrt{\epsilon_r(1+j\tan\delta)}\right)\right).$$

Based on electromagnetic wave theory and the above expressions, the reflected waves may be ideally (fully) absorbed, if the absorbing material satisfies the following conditions:

the loss tangent, tan δ, may be above one (>1) for a frequency range of a resonant frequency of the reflected noise signal and, in ideal conditions, may remain constant across the frequency range;

the dielectric constant, $\in_r$, may be inversely proportional to frequency, so that the loss factor may remain constant for the frequency range of the frequency of the reflected noise signal.

The above requirements are formulated for ideal absorption (e.g., elimination) of reflected noise signal by an absorbing material. Different types of absorbing materials with properties approximating or satisfying the above conditions with desired threshold margins may be used to at least partially reduce or substantially eliminate reflected noise signals in the interconnect stubs. For example, absorbing materials may be used that are produced by Cuming Microwave Corporation, MAST, Western Rubber and Supply, Inc., and the like. For example, Cuming Microwave Corporation's C-RAM MT-30 absorbing material may be used for the purposes of at least partial absorption of a reflected noise signal.

Figure 11:
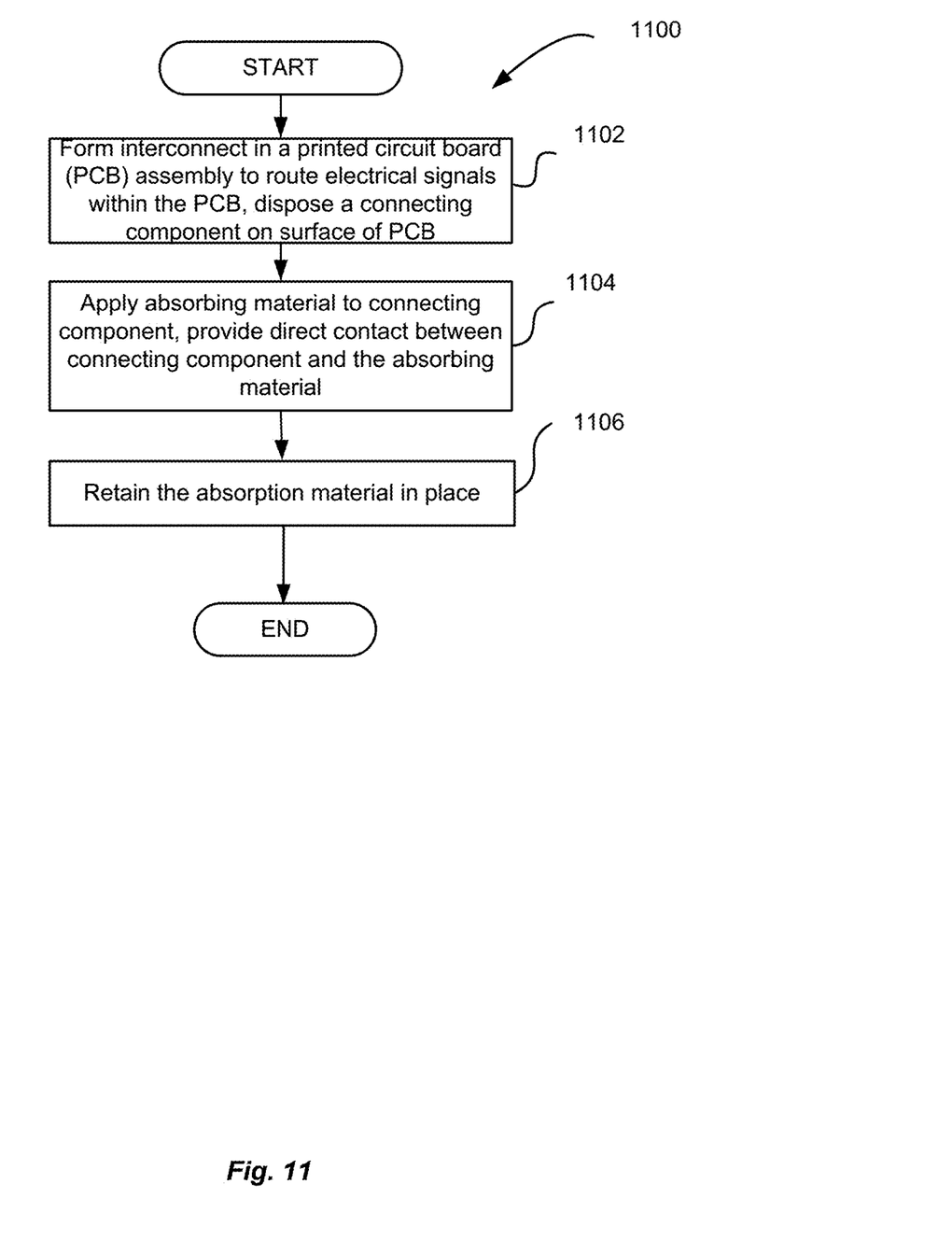
FIG. 11 is a process flow diagram for providing an absorbing material to an interconnect in a PCB assembly, in accordance with some embodiments.

FIG. 11 is a process flow diagram for applying an absorbing material to an interconnect in an apparatus, such as a PCB assembly, in order to provide at least partial absorption of a portion of an electrical signal, in accordance with some embodiments. The process 1100 may comport with actions described in connection with FIGS. 1-10 in some embodiments.

At block 1102, one or more interconnects may be formed in a printed circuit board (PCB) assembly to route electrical signals within the PCB. In some embodiments, the interconnects may comprise connecting components, vias, transmission lines, or other types of interconnects, described in reference to FIGS. 1-3. In some embodiments, the interconnect may include connecting components, transmission lines, vias, and ports described in reference to FIGS. 4-10. Forming the interconnect may include disposing a connecting component of the interconnect at least partially on a surface of the PCB. The connecting component may comprise, for example, a slot described in reference to FIGS. 1-3 or a port described in reference to FIGS. 4-6.

Figure 2:
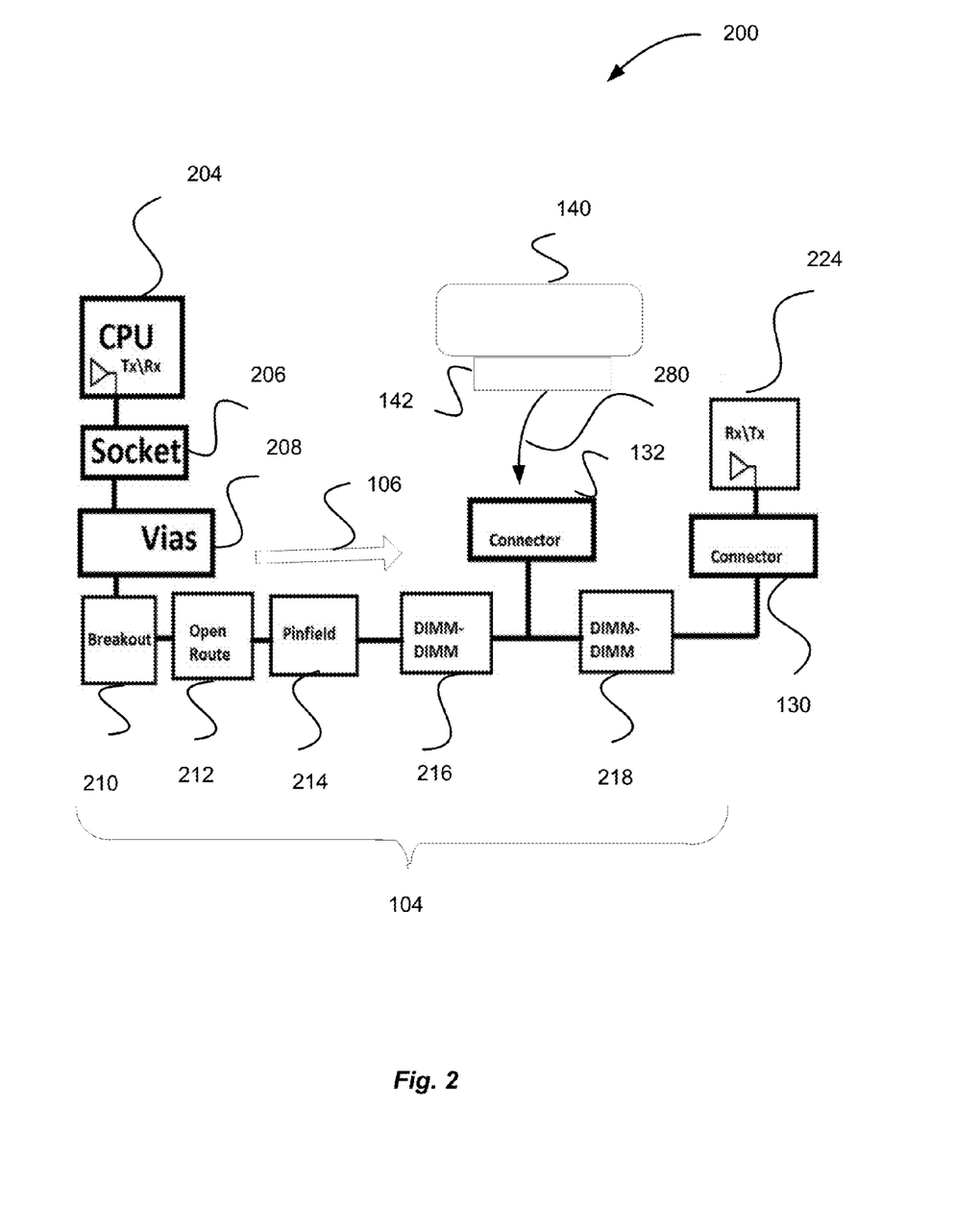
FIG. 2 schematically illustrates a signaling diagram of a PCB assembly having an interconnect of FIG. 1, in accordance with some embodiments.

At block 1104, an absorbing material may be applied to at least a portion of the connecting component, including providing a direct contact between the connecting component and the absorbing material, to at least partially absorb a portion of the incoming electrical signal, e.g., to reduce the reflected noise signals described in reference to FIGS. 1-3 or to substantially terminate signals described in reference to FIGS. 4-6. Applying an absorbing material may include covering at least portions of the connecting component with the absorbing material as described in reference to FIGS. 1-6.

In some embodiments, prior to applying the absorbing material to the interconnect stubs, the absorbing material may be selected according to the criteria described above. For example, the absorbing material may be selected such that a dielectric loss tangent of the absorbing material may be greater than one, for a frequency range of a frequency of the reflected portions of the electric signals. The absorbing material may be further selected such that a relative dielectric constant of the absorbing material may be inversely proportionate to the frequency of the reflected portions of the electric signals.

At block 1106, the absorbing material may be retained in place, e.g., by fastening, gluing, applying pressure, or other methods.

Figure 12:
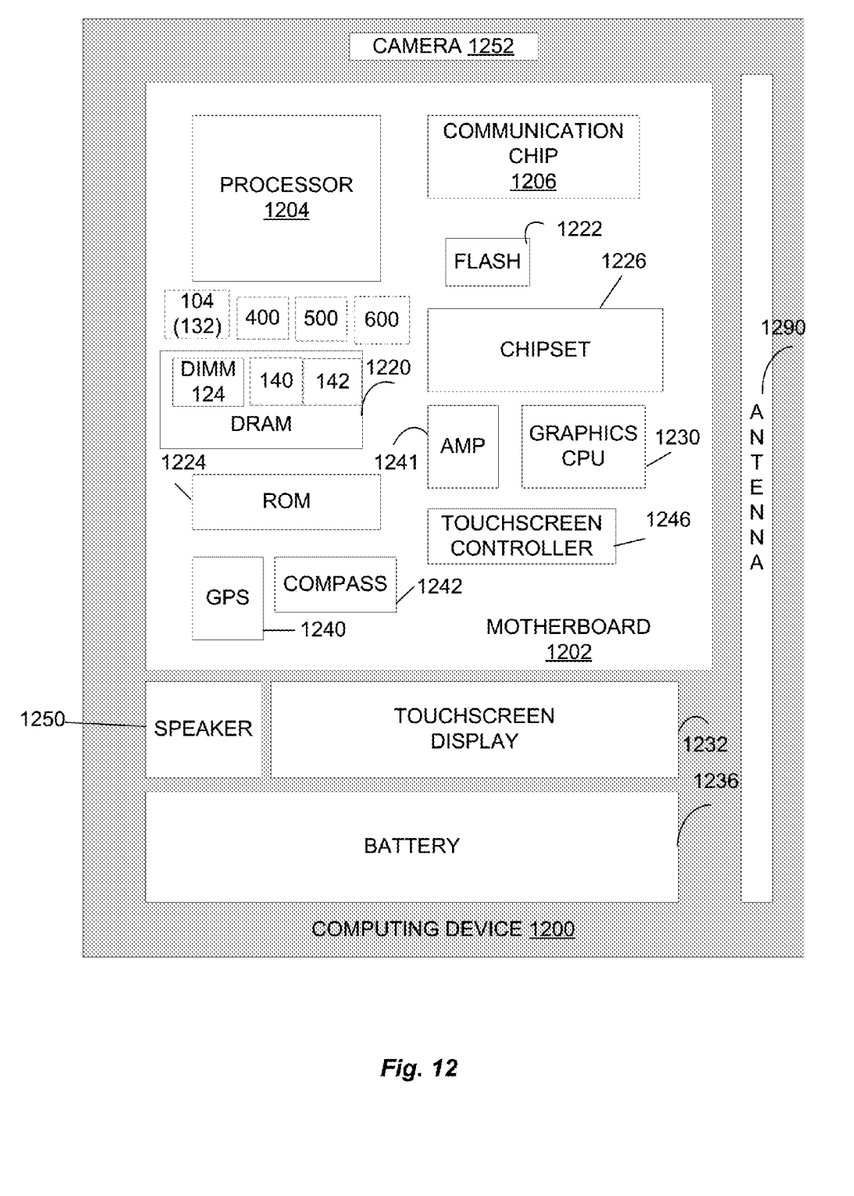
FIG. 12 schematically illustrates a computing device including a PCB assembly in accordance with some embodiments.

FIG. 12 schematically illustrates a computing device 1200 including at least a PCB assembly in accordance with some embodiments described in reference to FIGS. 1-11. The computing device 1200 may house a board such as motherboard 1202. The motherboard 1202 may be implemented as the PCB assembly 100 described in reference to FIG. 1 or PCB assemblies described in reference to FIGS. 4-6.

The motherboard 1202 may include a number of components, including but not limited to a processor 1204 and at least one communication chip 1206. One or more of the components in FIG. 12 shown as being attached to the motherboard may be replaced by a connecting component comprising absorbing material.

The processor 1204 may be physically and electrically coupled to the motherboard 1202. In some implementations, the at least one communication chip 1206 may also be physically and electrically coupled to the motherboard 1202. In further implementations, the communication chip 1206 may be part of the processor 1204.

Depending on its applications, computing device 1200 may include other components that may or may not be physically and electrically coupled to the motherboard 1202. These other components may include, but are not limited to, volatile memory (e.g., dynamic random-access memory (DRAM)) 1220, non-volatile memory (e.g., read-only memory (ROM)) 1224, flash memory 1222, a graphics processor 1230, a digital signal processor or a crypto processor (not shown), a chipset 1226, an antenna 1290, a display (e.g., touchscreen display) 1232, a touchscreen controller 1246, a battery 1236, a power amplifier 1241, a global positioning system (GPS) device 1240, a compass 1242, a speaker 1250, a camera 1252, a mass storage device (such as hard disk drive, compact disk (CD), or digital versatile disk (DVD)), an audio codec, a video codec, a Geiger counter, an accelerometer, a gyroscope (not shown), and so forth.

In some embodiments, DRAM 1220 may include a computing component 124, such as memory module (e.g., DIMM) coupled with the processor 1204 via interconnect 104 as described in reference to FIGS. 1-2. DRAM 1220 may further include a computing component (e.g., dummy module) 140 with connecting element 142 configured and connected to the interconnect 104 via connecting component 132 of interconnect 104 as described in reference to FIGS. 1-3, to at least partially absorb reflected noise signals.

In some embodiments, the computing device 1200 may be configured with interconnects 400, 500, or 600, for signal measurements according to the embodiments described in reference to FIGS. 4-6. As described above, the interconnects 400, 500, or 600 may include absorbing terminators comprising absorbing material as described in reference to FIGS. 7-10, to provide effective termination of electrical signals traveling through portions of interconnects 400, 500, or 600.

The communication chip 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards.

The communication chip 1206 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1206 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1206 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1206 may operate in accordance with other wireless protocols in other embodiments.

The computing device 1200 may include a plurality of communication chips 1206. For instance, a first communication chip 1206 may be dedicated to shorter range wireless communications such as Wi-Fi and Bluetooth, and a second communication chip 1206 may be dedicated to longer range wireless communications such as GPS, EDGE, GPRS, CDMA, WiMAX, LTE, EV-DO, and others.

The processor 1204 may refer to any device or portion of a device that processes electronic data from registers and/or memory to transform that electronic data into other electronic data that may be stored in registers and/or memory.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

According to various embodiments, the present disclosure describes a number of examples. Example 1 is a printed circuit board (PCB) assembly for absorbing a reflected electric signal, comprising a substrate, at least one interconnect formed in the substrate to route an electrical signal within the PCB, wherein the interconnect includes a connecting component that is disposed on a surface of the PCB, and an absorbing material that is disposed to be in direct contact with at least a portion of the connecting component to at least partially absorb a portion of the electrical signal.

Example 2 may include the subject matter of Example 1, and further specifies that the interconnect comprises a transmission line that includes the connecting component, wherein a proximal end of the transmission line that comprises the connecting component is disposed on the surface of the PCB to form a port for the electrical signal passing through the transmission line, wherein the port is covered with the absorbing material to form a first absorbing terminator to provide substantial termination of the electrical signal.

Example 3 may include the subject matter of Example 2, and further specifies that the first end of the transmission line is connected to a transmitter to transmit the electrical signal through the transmission line, wherein the port comprises a second end of the transmission line.

Example 4 may include the subject matter of Example 3, and further specifies that the transmission line is a first transmission line, wherein the interconnect further comprises a second transmission line disposed in proximity to the first transmission line, wherein the second transmission line includes a second absorbing terminator comprising a first end of the second transmission line covered with the absorbing material.

Example 5 may include the subject matter of Example 4, and further specifies that the first end of the second transmission line is disposed in proximity to the first end of the first transmission line, wherein a second end of the second transmission line is connected to a receiver of a signal caused by magnetic interference from the electric signal passing through the first transmission line, wherein an arrangement including the first and second transmission lines is to enable measurements of far end cross-talk (FEXT) associated with the electrical signal.

Example 6 may include the subject matter of Example 4, and further specifies that the PCB assembly may further comprise a third absorbing terminator disposed at a second end of the second transmission line, wherein an arrangement including the first and second transmission lines is to enable measurements of FEXT return loss associated with the electrical signal.

Example 7 may include the subject matter of Example 4, and further specifies that a second end of the second transmission line is disposed in proximity to the first end of the first transmission line and connected to a receiver of a signal caused by magnetic interference from the electric signal passing through the first transmission line, wherein an arrangement including the first and second transmission lines is to enable measurements of near end cross-talk (NEXT) associated with the electrical signal.

Example 8 may include the subject matter of Example 1, and further specifies that the electrical signal comprises a transmission signal transmitted with a speed above a threshold of about 1 gigabits per second (Gbps).

Example 9 may include the subject matter of Example 1, and further specifies that the connecting component is a first connecting component that comprises a first connector slot to receive a corresponding first connecting element of a first computing component to be coupled with the PCB assembly.

Example 10 may include the subject matter of Example 9, and further specifies that the PCB assembly may further comprise a second connecting component that comprises a second connector slot to receive a corresponding second connecting element of a second computing component to be coupled with the PCB assembly.

Example 11 may include the subject matter of Example 10, and further specifies that the first computing component comprises a dummy module, wherein the first connecting element of the dummy module includes the absorbing material, wherein the connecting component is covered with the absorbing material when the first connecting element of the first computing component is inserted into the first connector slot, wherein the absorbing material is in direct contact with an inside portion of the first connector slot.

Example 12 may include the subject matter of Example 11, and further specifies that the second computing component comprises a memory module to receive and store data comprising the electrical signal routed within the PCB, wherein the portion of the electrical signal to be at least partially absorbed by the first connecting component comprises a reflected portion of the electrical signal.

Example 13 may include the subject matter of Example 12, and further specifies that the memory module comprises a dual in-line memory module (DIMM).

Example 14 may include the subject matter of Examples 1 to 13, and further specifies that that the absorbing material has a dielectric loss tangent of greater than one, for a frequency range of a resonant frequency of a reflected portion of the electrical signal that is to be at least partially absorbed.

Example 15 may include the subject matter of Example 14, and further specifies a relative dielectric constant is inversely proportionate to the frequency of the reflected portion of the electric signal that is to be at least partially absorbed.

Example 16 may include the subject matter of Example 15, and further specifies that the dielectric loss tangent of the absorbing material is substantially constant for the resonant frequency range of the frequency of the reflected portion of the electric signal that is to be at least partially absorbed.

Example 17 is a method forming at least one interconnect on a printed circuit board (PCB) assembly to route electrical signals within the PCB, the forming including disposing a connecting component of the interconnect at least partially on a surface of the PCB and applying an absorbing material to at least a portion of the connecting component, including providing a direct contact between the connecting component and the absorbing material, to at least partially absorb a portion of the electrical signal.

Example 18 may include the subject matter of Example 17, and further specifies that the disposing includes providing a first transmission line, with a first proximal end of the first transmission line comprising the connecting component forming a port for the electrical signal passing through the first transmission line, wherein applying the absorbing material includes covering the port with the absorbing material to form a first absorbing terminator to provide substantial termination of the electrical signal, the covering including retaining the absorbing material in place by fastening or gluing.

Example 19 may include the subject matter of Example 18, and further specifies that connecting a first end of the first transmission line to a transmitter to transmit the electrical signal through the first transmission line, wherein the first proximal end of the first transmission line including the port comprises a second end of the first transmission line; disposing a second transmission line in proximity to the first transmission line, the disposing including forming a second absorbing terminator at a second proximal end of the second transmission line by covering the second proximal end with the absorbing material, the covering including retaining the absorbing material in place by fastening or gluing, wherein an arrangement including the first and second transmission lines enables measurements of far end cross-talk (FEXT) and near end cross-talk (NEXT) associated with the electrical signal.

Example 20 may include the subject matter of Examples 17 to 19, and further specifies that the disposing includes providing a first connector slot comprising the connecting component, the connector slot configured to receive a corresponding first connecting element of a first computing component to be coupled with the PCB assembly.

Example 21 may include the subject matter of Example 20, and further specifies that the first computing component comprises a dummy module, wherein the connecting element of the dummy module includes the absorbing material, wherein applying an absorbing material includes inserting the connecting element of the dummy module into the first connector slot, to provide direct contact of the absorbing material with an inside portion of the first connector slot.

Example 22 may include the subject matter of Example 21, and further specifies that the method may further comprise providing a second connecting component that comprises a second connector slot to receive a corresponding second connecting element of a second computing component to be coupled with the PCB assembly, wherein the second computing component comprises a memory module to receive and store data comprising the electrical signal routed within the PCB, wherein the portion of the electrical signal to be at least partially absorbed by the first connecting component comprises a reflected portion of the electrical signal.

Example 23 is a computing apparatus comprising processor, a memory coupled with the processor and a printed circuit board (PCB) assembly coupled with the processor and memory, the PCB assembly comprising: a substrate; at least one interconnect formed in the substrate to route an electrical signal within the PCB, wherein the interconnect includes a connecting component that is disposed on a surface of the PCB; and an absorbing material that is disposed to be in direct contact with at least a portion of the connecting component to at least partially absorb a portion of the electrical signal.

Example 24 may include the subject matter of Example 23, and further specifies that the interconnect comprises a transmission line that includes the connecting component, wherein a proximal end of the transmission line that comprises the connecting component is disposed on the surface of the PCB to form a port for the electrical signal passing through the transmission line, wherein the port is covered with the absorbing material to form a first absorbing terminator to provide substantial termination of the electrical signal.

Example 25 may include the subject matter of Examples 23 to 24, and further specifies that the connecting component is a first connecting component that comprises a first connector slot to receive a corresponding first connecting element of a first computing component to be coupled with the PCB assembly, wherein the computing apparatus further comprises a second connecting component that includes a second connector slot to receive a corresponding second connecting element of a second computing component to be coupled with the PCB assembly, wherein the first computing component comprises a dummy module, wherein the connecting element of the dummy module includes the absorbing material to cover the connecting component when the first computing component is inserted into the first connector slot.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A printed circuit board (PCB) assembly comprising:
   a substrate;
   at least one interconnect comprising a transmission line formed inside the substrate to route an electrical signal within the PCB, wherein at least one end of the transmission line reaches a surface of the PCB and is coupled with a connecting component that comprises a connector slot disposed on the surface of the PCB; wherein the connector slot is to receive a corresponding connecting element of an insertable component to be coupled with the PCB assembly, wherein at least a surface of the connecting element that faces the connector slot is directly covered with an absorbing material that is disposed to be in direct contact with at least a portion of the connector slot in response to insertion of the connecting element into the connector slot.

2. The PCB assembly of claim 1, wherein the interconnect comprises a transmission line that includes the connecting component, wherein a second end of the transmission line that comprises the connecting component is disposed on the surface of the PCB to form a port for the electrical signal passing through the transmission line, wherein the port is covered with the absorbing material to form a first absorbing terminator to provide substantial termination of the electrical signal.

3. The PCB assembly of claim 2, wherein a first end of the transmission line is connected to a transmitter to transmit the electrical signal through the transmission line, and wherein the port comprises the second end of the transmission line.

4. The PCB assembly of claim 3, wherein the transmission line is a first transmission line, wherein the at least one interconnect further comprises a second transmission line disposed in proximity to the first transmission line, wherein the second transmission line includes a second absorbing terminator comprising a first end of the second transmission line covered with the absorbing material.

5. The PCB assembly of claim 4, wherein the first end of the second transmission line is disposed in proximity to the first end of the first transmission line, wherein a second end of the second transmission line is connected to a receiver of a signal caused by magnetic interference from the electrical signal passing through the first transmission line, wherein an arrangement including the first and second transmission lines is to enable measurements of far end cross-talk (FEXT) associated with the electrical signal.

6. The PCB assembly of claim 4, further comprising a third absorbing terminator disposed at a second end of the second transmission line, wherein an arrangement including the first and second transmission lines is to enable measurements of FEXT return loss associated with the electrical signal.

7. The PCB assembly of claim 4, wherein a second end of the second transmission line is disposed in proximity to the first end of the first transmission line and connected to a receiver of a signal caused by magnetic interference from the electrical signal passing through the first transmission line, wherein an arrangement including the first and second transmission lines is to enable measurements of near end cross-talk (NEXT) associated with the electrical signal.

8. The PCB assembly of claim 1, wherein the connecting component is a first connecting component, wherein the connector slot is a first connector slot, wherein the connecting element is a first connecting element, and wherein the insertable component is a first computing component to be coupled with the PCB assembly.

9. The PCB assembly of claim 8, further comprising a second connecting component coupled with the at least one interconnect, wherein the second connecting component comprises a second connector slot to receive a corresponding second connecting element of a second computing component to be coupled with the PCB assembly.

10. The PCB assembly of claim 9, wherein the absorbing material is in direct contact with an inside portion of the first connector slot in response to the insertion of the first connecting element of the first computing component into the first connector slot.

11. The PCB assembly of claim 10, wherein the second computing component comprises a memory module to receive and store data comprising the electrical signal routed within the PCB, wherein the portion of the electrical signal to be at least partially absorbed by the first connecting component comprises a reflected portion of the electrical signal.

12. The PCB assembly of claim 1, wherein the absorbing material has a dielectric loss tangent of greater than one, for a frequency range of a resonant frequency of a reflected portion of the electrical signal that is to be at least partially absorbed.

13. The PCB assembly of claim 12, wherein a relative dielectric constant is inversely proportionate to the frequency of the reflected portion of the electrical signal that is to be at least partially absorbed.

14. The PCB assembly of claim 13, wherein the dielectric loss tangent of the absorbing material is substantially constant for the resonant frequency range of the frequency of the reflected portion of the electrical signal that is to be at least partially absorbed.

15. The PCB assembly of claim 1, wherein the at least one interconnect is capable of carrying the electrical signal that comprises a transmission signal transmitted with a speed above a threshold of about 1 gigabits per second (Gbps).

16. A method, comprising:
   forming at least one interconnect on a printed circuit board (PCB) assembly to route electrical signals within the PCB, the forming including forming a transmission line inside the substrate to route an electrical signal within the PCB, and disposing a connecting component of the interconnect at least partially on a surface of the PCB, wherein the connecting component comprises a connector slot to receive a corresponding connecting element of an insertable component to be coupled with the PCB assembly; and
   applying an absorbing material to at least a portion of the connecting component, including providing a direct contact between the connecting component and the absorbing material, to at least partially absorb a portion of the electrical signal, applying further including directly covering at least a surface of the connecting element that faces the connector slot with the absorbing material.

17. The method of claim 16, wherein the disposing includes providing a first transmission line, with a first proximal end of the first transmission line comprising the connecting component forming a port for the electrical signal passing through the first transmission line, wherein applying the absorbing material includes covering the port with the absorbing material to form a first absorbing terminator to provide substantial termination of the electrical signal, the covering including retaining the absorbing material in place by fastening or gluing.

18. The method of claim 17, further comprising:
connecting a first end of the first transmission line to a transmitter to transmit the electrical signal through the first transmission line, wherein the first proximal end of the first transmission line including the port comprises a second end of the first transmission line;
disposing a second transmission line in proximity to the first transmission line, the disposing including forming a second absorbing terminator at a second proximal end of the second transmission line by covering the second proximal end with the absorbing material, the covering including retaining the absorbing material in place by fastening or gluing.

19. The method of claim 18, further comprising:
conducting measurements of far end cross-talk (FEXT) or near end cross-talk (NEXT) associated with the electrical signal.

20. The method of claim 16, wherein the connector slot is a first connector slot, wherein the connecting element is a first connecting element, and wherein the insertable component is a first computing component to.

21. The method of claim 20, wherein the first computing component comprises a dummy module, wherein applying an absorbing material includes inserting the connecting element of the dummy module into the first connector slot, to provide direct contact of the absorbing material with an inside portion of the first connector slot.

22. The method of claim 21, further comprising:
providing a second connecting component that comprises a second connector slot to receive a corresponding second connecting element of a second computing component to be coupled with the PCB assembly, wherein the second computing component comprises a memory module to receive and store data comprising the electrical signal routed within the PCB, wherein the portion of the electrical signal to be at least partially absorbed by the first connecting component comprises a reflected portion of the electrical signal.

23. A computing apparatus, comprising:
a processor;
a memory coupled with the processor; and
a printed circuit board (PCB) assembly coupled with the processor and memory, the PCB assembly comprising:
a substrate;
at least one interconnect comprising a transmission line formed in the substrate to route an electrical signal within the PCB, wherein at least one end of the transmission line reaches a surface of the PCB and is coupled with a connecting component that comprises a connector slot disposed on the surface of the PCB, wherein the connector slot is to receive a corresponding connecting element of an insertable component to be coupled with the PCB assembly, wherein at least a surface of the connecting element that faces the connector slot is directly covered with an absorbing material that is disposed to be in direct contact with at least a portion of the connector slot to at least partially absorb a portion of the electrical signal.

24. The computing apparatus of claim 23, wherein the interconnect comprises a transmission line that includes the connecting component, wherein a proximal end of the transmission line that comprises the connecting component is disposed on the surface of the PCB to form a port for the electrical signal passing through the transmission line, wherein the port is covered with the absorbing material to form a first absorbing terminator to provide substantial termination of the electrical signal.

25. The computing apparatus of claim 23, wherein the connecting component is a first connecting component, wherein the connector slot is a first connector slot, wherein the connecting element is a first connecting element, wherein the insertable component is a first computing component to be coupled with the PCB assembly, wherein the computing apparatus further comprises a second connecting component that includes a second connector slot to receive a corresponding second connecting element of a second computing component to be coupled with the PCB assembly, wherein the first computing component comprises a dummy module.

* * * * *